United States Patent [19]

Sherman, Jr.

[11] 4,069,455
[45] Jan. 17, 1978

[54] ARRANGEMENT FOR MAINTAINING RECEPTION OF A RADIO RECEIVER ON THE STRONGER OF TWO SIGNALS

[75] Inventor: Ralph R. Sherman, Jr., Forest, Va.

[73] Assignee: General Electric Company, Lynchburg, Va.

[21] Appl. No.: 740,825

[22] Filed: Nov. 11, 1976

[51] Int. Cl.² .............................................. H04B 1/32
[52] U.S. Cl. ..................................... 325/469; 325/51; 325/56; 325/63; 325/453
[58] Field of Search ....................... 325/51, 53, 54, 56, 325/63, 452, 453, 457, 465, 468, 469, 470, 304, 306, 307; 343/205, 206

[56] References Cited

U.S. PATENT DOCUMENTS

| | | | |
|---|---|---|---|
| 3,443,228 | 5/1969 | Brenner et al. | 325/56 |
| 3,470,481 | 9/1969 | Myers et al. | 325/470 |
| 3,497,813 | 2/1970 | Gallagher | 325/453 |
| 3,532,988 | 10/1970 | Magnuski | 325/63 |
| 3,617,895 | 11/1971 | Tomsa et al. | 325/469 |
| 3,619,788 | 11/1971 | Giles, Jr. | 325/470 |
| 3,983,492 | 9/1976 | Fisher et al. | 325/56 X |

*Primary Examiner*—Robert L. Griffin
*Assistant Examiner*—Jin F. Ng
*Attorney, Agent, or Firm*—James J. Williams

[57] ABSTRACT

A radio receiver is provided with a local oscillator whose frequency is switched so that the receiver is normally receptive to the stronger signal but so that the receiver is momentarily and periodically made receptive to the other weaker signal. A circuit compares the relative strengths of the two signals, and if the weaker signal becomes stronger than the previously stronger signal, then reception is switched to the now stronger signal with momentary and periodic reception of the now weaker signal. Thus, interference-free and good reception of the transmitted information is provided.

6 Claims, 4 Drawing Figures

ARRANGEMENT FOR MAINTAINING RECEPTION OF A RADIO RECEIVER ON THE STRONGER OF TWO SIGNALS

BACKGROUND OF THE INVENTION

My invention relates to switching reception of a radio receiver between two signals on different frequencies, and particularly to maintaining reception of the receiver on the stronger of the two signals while periodically and momentarily sampling the weaker of the two signals. If the weaker signal becomes stronger, reception is always changed to the stronger signal with sampling of the weaker signal.

Some radio communication systems require that a single source of information be received over a wide area. In such a system, the single source of information is transmitted by several radio transmitters which are located so that a receiver for the information will be able to obtain a useable signal anywhere in the area to be covered. Each of the radio transmitters transmits on one of two frequencies so that in areas where the coverage of two adjacent transmitters overlaps, reception is obtained by tuning the receiver to only one of the two transmitters. In an overlap area, the receiver should always be tuned to the stronger of the two signals. Accordingly, a principal object of my invention is to provide a novel arrangement for tuning a radio receiver to the stronger of two transmitted signals.

In some instances, the received signal strength of the two transmitted signals may vary with time, particularly if the receiver is mobile and is moving through an area where the two transmitted signals overlap. Accordingly, another object of my invention is to provide a new and improved arrangement for tuning a radio receiver to the frequency of a stronger signal for reception, periodically and momentarily tuning the receiver to the frequency of a weaker signal, and switching reception to the weaker signal if it becomes stronger.

SUMMARY OF THE INVENTION

Briefly, these and other objects are achieved in accordance with my invention by a receiver having a local oscillator which can provide one of two frequencies that cause the receiver to be receptive to one of two radio signals respectively. The oscillator is under the control of a switching circuit which produces repetitive and alternating control signals of relatively long duration and short duration. Reception of received information takes place during each long duration control signal. During reception, the strength of the received signal is sampled and held in a first circuit. During a short duration control signal, the strength of the other signal is sampled and held in a second circuit. The two sampled and held signals are compared. As long as the signal strength of the long duration signal exceeds the signal strength of the short duration signal, reception continues on the radio frequency providing the greater signal strength. If the signal strength of the short duration signal exceeds the signal strength of the long duration signal, the switching circuit reverses its outputs so that reception is provided by the now stronger signal, with short duration samplings of the now weaker signal. The operation is continuous, with switching of the reception and sampling being provided in response to each change in the relative strengths of the two signals.

BRIEF DESCRIPTION OF THE DRAWING

The subject matter which I regard as my invention is particularly pointed out and distinctly claimed in the claims. The structure and operation of my invention, together with further objects and advantages, may be better understood from the following description given in connection with the accompanying drawing, in which:

DESCRIPTION OF A PREFERRED EMBODIMENT

Figure 1:
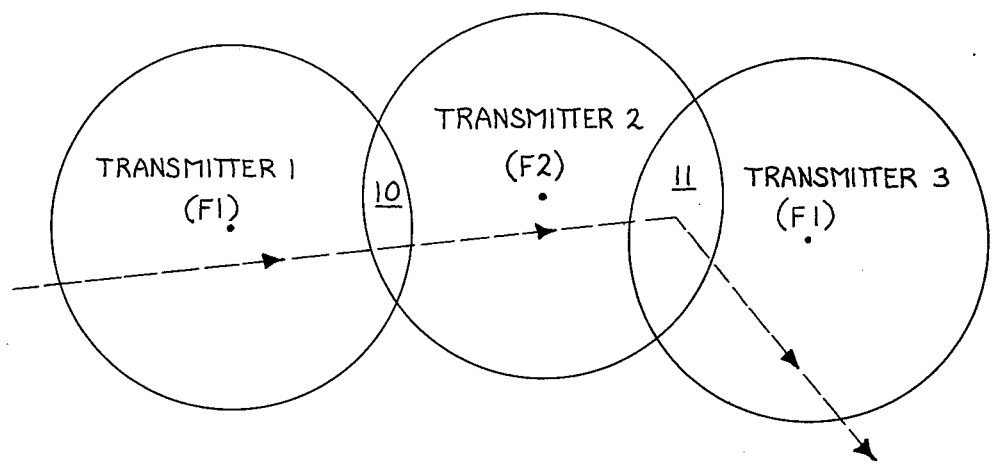
FIG. 1 illustrates a communication system for which my invention is provided.

In FIG. 1, I have shown an example of a communication system to which my arrangement is applicable. In FIG. 1, I have assumed that a single source of information is to be transmitted over an area represented by the three circles so that a radio receiver in that area can receive and reproduce the transmitted information. Because a radio receiver may be located anywhere within the area, it is desirable that adjacent transmitters transmit on different radio frequencies so as to avoid distortion or a condition of no reception. Hence, the transmitters 1 and 3 would transmit on a first frequency F1, and the intermediate transmitter 2 would transmit on a second frequency F2. As a mobile receiver moves in the area, such as along a path represented by the dashed line, it should be receptive to the radio frequency providing the greater signal strength to the location of the receiver. Generally, the receiver would be receptive to the signal of frequency F1 in the proximity of the transmitter 1. However, as the receiver moves toward transmitter 2, it approaches an overlap area 10 where, depending upon exact conditions, the strength of the signal of frequency F2 may approach or exceed the strength of the signal of frequency F1. A similar condition would exist in the overlap area 11 between transmitter 2 and transmitter 3. For these reasons, it is desirable, if not essential, that reception of the receiver be switched to the frequency of the signal providing the greater strength so as to insure good, clear reception. This could be achieved by an operator manually switching the frequency of reception of the receiver. This is difficult or tiring for the operator, and may be impossible where the operator is driving a vehicle or is otherwise occupied. Accordingly, a need exists for an arrangement to automatically switch reception of the receiver to the stronger of two receivable signals.

Figure 2:
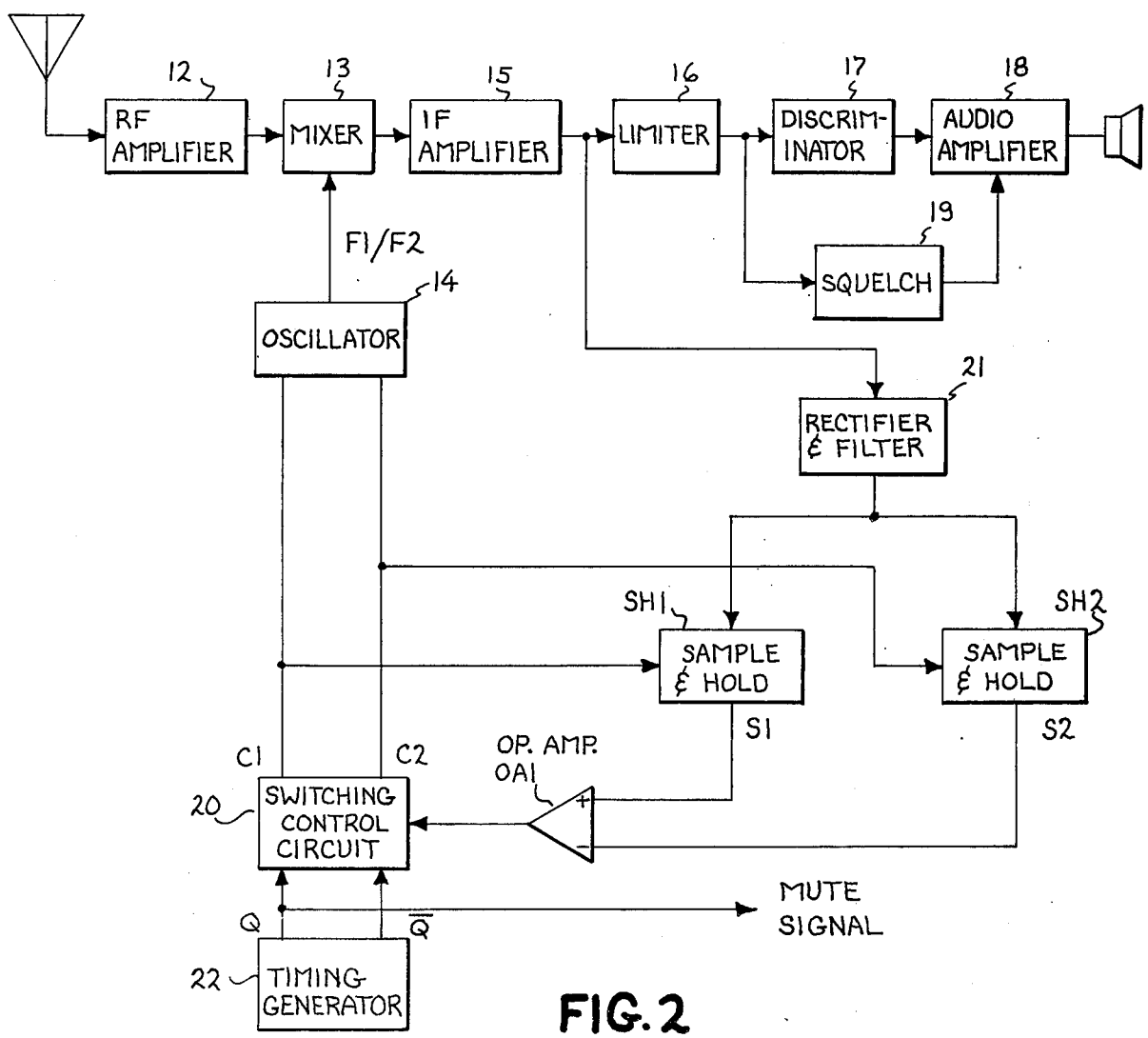
FIG. 2 shows a block diagram of a radio receiver having an arrangement in accordance with my invention for maintaining reception of the receiver on the stronger of the two received signals.

FIG. 2 shows a block diagram of a radio receiver provided with an arrangement in accordance with my invention for achieving this. In FIG. 2, I have assumed that the radio receiver provided with my arrangement is intended to receive frequency modulated (FM) signals. However, it is to be understood that my arrangement can be used with other types of receivers, such as an amplitude modulated (AM) receiver. The receiver of FIG. 2 typically includes a radio frequency (RF) amplifier 12 provided with radio frequency signals from an antenna. The amplified signals are heterodyned or mixed in a mixer 13 with signals supplied from a local oscillator 14 to produce intermediate frequency signals. These intermediate frequency signals are amplified by an intermediate frequency (IF) amplifier 15, and then amplitude-limited in a limiter 16. The output of the limiter 16 is applied to a discriminator 17 which converts the limited signals to audio signals. The audio signals are amplified in an audio amplifier 18 for application to a loudspeaker as shown or some other suitable device. The FM receiver may also include a squelch circuit 19 for the purpose of squelching or cutting off the audio amplifier 18 in the absence of received signals, a condition indicated by an output from the limiter 16.

The receiver as described thus far is known in the art. The exact frequency of reception of the receiver is determined by the frequency of signals supplied by the oscillator 14 to the mixer 13. In accordance with my invention, the frequency of the oscillator 14 is under the control of a switching control circuit 20. The switching control circuit 20 produces two sequential and alternating control signals C1, C2 which, when applied to the oscillator 14, cause the oscillator 14 to produce a frequency F1 or a frequency F2, depending upon which signal the control circuit 20 supplies. When the signal C1 is supplied, the receiver is made receptive to a radio frequency corresponding to the frequency F1; and when the signal C2 is supplied, the receiver is made receptive to a radio frequency corresponding to the frequency F2. These control signals C1, C2 are also respectively applied to sample and hold circuits SH1, SH2 to cause these circuits to sample a DC signal supplied by a rectifier and filter 21 and hold the sampled signals until another sample is taken. The rectifier and filter 21 is coupled to an appropriate point in the receiver which is indicative of the received signal strength. For example, the sampling signal can be derived at the output of the IF amplifier 15 before any limiting takes place. The rectifier and filter 21 rectifies the IF signal, and produces a filtered direct current signal indicative of the amplitude. When the control signal C1 is produced, the receiver is responsive to the corresponding radio frequency signal F1, and the sample and hold circuit SH1 samples and holds a DC signal indicative of the received strength of this signal. When the control signal C2 is produced, the receiver is responsive to the corresponding radio frequency signal F2 whose strength is sampled and held by the circuit SH2.

The sample and hold circuits SH1, SH2 produce direct current signals S1, S2 which have magnitudes indicative of the sampled and held signals during the times of the control signals C1, C2 respectively. These signals S1, S2 are applied to the plus and minus inputs respectively of an operational amplifier OA1 which is connected in differential fashion. If the signal S1 at the plus input exceeds the signal S2 at the minus input, the amplifier OA1 produces a high or logic 1 signal; and if the signal S2 at the minus input exceeds the signal S1 at the plus input, the amplifier OA1 produces a low or zero output. Thus, the amplifier OA1 compares the relative magnitudes of the signals S1, S2. The output of the amplifier OA1 is applied to the switching control circuit 20 for controlling the time durations of the signals C1, C2. The switching control circuit 20 is supplied with signals Q, $\bar{Q}$ from a timing generator 22. These signals Q, $\bar{Q}$ are the reciprocal or logic inversion of each other. If the amplifier OA1 produces a low or logic 0 output, the generator signal $\bar{Q}$ is supplied by the circuit 20 as the signal C1 and the generator signal Q is supplied by the circuit 20 as the signal C2. If the amplifier OA1 output is high, or a logic 1, the switching control circuit reverses or inverts these signals Q, $\bar{Q}$ so that the generator signal Q is supplied as the signal C2 and the generator signal $\bar{Q}$ is supplied as the signal C1. As will be explained, I prefer that the effective part of the signal Q be of relatively short duration and the effective part of the signal $\bar{Q}$ be of correspondingly long duration so that the receiver is receptive to the frequency signal corresponding to the $\bar{Q}$ signal for a long time, and samples the frequency corresponding to the Q signal for a short time. As indicated, the Q signal may also be used as a mute signal to cut off the receiver audio during the short sample time so that a listener does not have to listen to noise during that short time. The mute signal can be applied to any suitable portion of the receiver, such as the audio amplifier.

Figure 3:
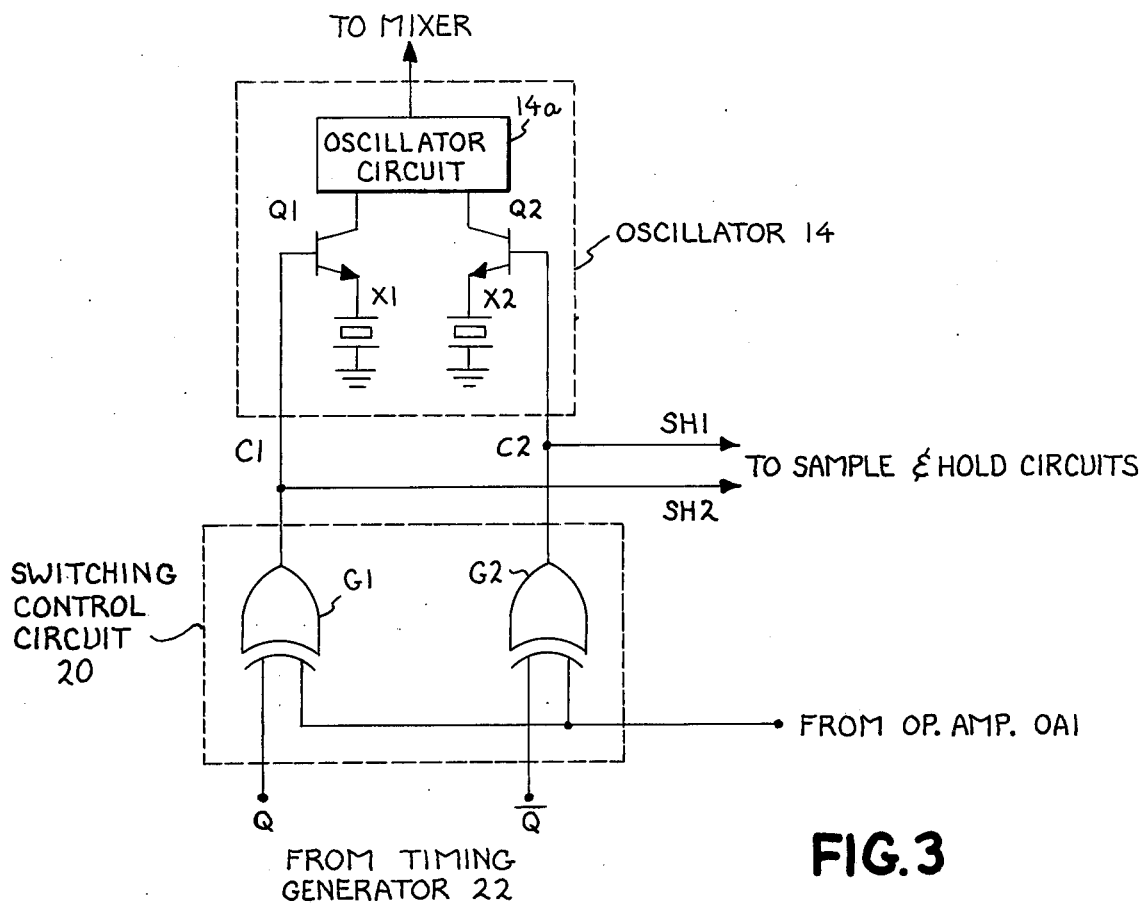
FIG. 3 shows a more detailed diagram of portions of my arrangement of FIG. 2.

The exact circuits forming the radio receiver may take a number of forms known in the art. Similarly, the oscillator 14, the rectifier and filter 21, the sample and hold circuits SH1, SH2, the amplifier OA1, the control circuit 20, and the generator 22 may take a number of forms. As shown in FIG. 3, the oscillator 14 may comprise two crystals X1, X2 which are respectively connected to the oscillator circuit shown as a solid line rectangle 14a through transistors Q1, Q2 respectively. When either one of the transistors Q1, Q2 is turned on, its respective crystal is connected through the transistor to control the frequency of the circuit 14a, and hence the frequency of reception of the receiver. The oscillator 14 may comprise two completely separate and self-contained crystal controlled oscillators, each of which is respectively operated or energized in response to the control signals C1, C2. The sample and hold circuits SH1, SH2 may each include a bidirectional switch (preferably electronic) which is turned on by its respective control signal to charge or discharge a capacitor to the DC voltage supplied by the rectifier and filter 21. The amplifier OA1 may be replaced by any type of circuit which provides a DC or logic comparison of the two applied signals S1, S2. The generator 22 may comprise a pulse generator which actuates a bistable multivibrator. The Q, $\bar{Q}$ signals produced by the generator 22 may have any desired effective lengths, such as 10 milliseconds and 240 milliseconds respectively as will be mentioned. The switching control circuit 20 may, in a simple form, comprise two exclusive OR gates G1, G2 as shown in FIG. 3. One input of each of the gates is connected to the operational amplifier OA1, and the other input of each of the gates G1, G2 is connected to the Q, $\bar{Q}$ outputs respectively of the generator 22. As known in the art, when one of the inputs of an exclusive OR gate is at a logic 0, the other input is reproduced in the same logic sense at the output. Conversely, if the one input of an exclusive OR gate is a logic 1, the output of the gate is the logic inversion of the other input. Thus, the exclusive OR gates G1, G2 provide a convenient and simple way of connecting the Q, $\bar{Q}$ signals as the C1, C2 signals respectively, or inverting them so that the Q, $\bar{Q}$ signals are produced as the C2, C1 signals respectively.

Figure 4:
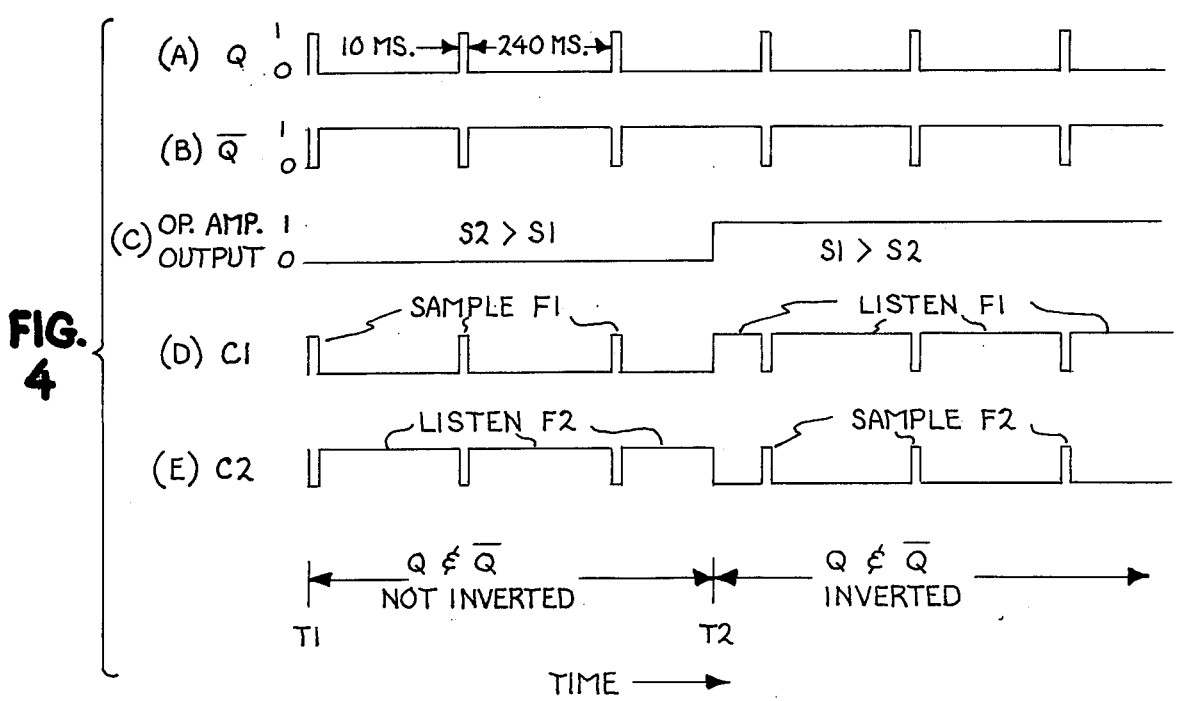
FIG. 4 shows wave forms illustrating the operation of my arrangement of FIGS. 2 and 3.

The operation of my invention can be understood by referring to FIG. 4 which shows wave forms plotted along a common time axis. The generator outputs Q, $\bar{Q}$ are shown in FIGS. 4(A) and 4(B). These outputs are reciprocal or the logic inversion of each other. At the time T1, I have assumed that the strength of the received radio signal corresponding to the F2 signal exceeds the strength of the radio signal corresponding to the F1 signal. Hence, the sample and hold output S2 exceeds the sample and hold output S1 and the amplifier output is low or logic 0 as illustrated in FIG. 4(C). Reception or listening is on the F2 signal as indicated in FIG. 4(E), and sampling is on the F1 signal as indicated in FIG. 4(D). Each Q signal is supplied as the C1 signal, and each $\bar{Q}$ signal is supplied as the C2 signal so that there is no switching or inversion by the circuit 20.

At the time T2, I have assumed that the strength of the signal corresponding to the F1 signal becomes greater than the strength of the signal corresponding to the F2 signal. Hence, the output of the amplifier OA1 switches from a low to a high value as indicated in FIG. 4(C). This causes the switching control circuit 20 to reverse or invert the Q and $\bar{Q}$ signals as indicated in FIGS. 4(D) and 4(E) so that listening takes place on the frequency corresponding to the signal F1 and sampling takes place on the frequency corresponding to the signal F2. And, of course, if the F2 signal should again exceed the F1 signal, the operation would switch back to the condition shown at the time T1.

The listening and sampling continue as long as the receiver is operated. While other listening and sampling times can be used, I prefer those in the vicinity of 240 and milliseconds for good listening and 10 milliseconds for good sampling (without annoyance to a listener particularly if the receiver is muted).

It will thus be seen that I have provided a new and improved arrangement for insuring that a radio receiver is receptive to one of two radio frequency signals. An important advantage of my arrangement over the prior art is that a single radio receiver can be utilized and be made receptive to one of two frequencies by switching its local oscillator in accordance with the relative signal strength being received. While I have shown only one embodiment of my invention, persons skilled in the art will appreciate that modifications may be made without departing from the spirit of the invention or from the scope of the claims.

What I claim as new and desire to secure by Letters Patent of the United States is:

1. For use in a radio receiver, an improved arrangement for causing said receiver to be receptive to the stronger of two radio frequency signals, said arrangement comprising:
   a. first and second sample and hold circuits having first and second signal inputs for sampling and holding signals indicative of the strength of signals received by said receiver, having first and second outputs, and having first and second control inputs for controlling the sampling times of said first and second sampling inputs respectively;
   b. a comparison circuit having first and second inputs connected to said first and second outputs respectively of said sample and hold circuits and having an output for producing a first output signal in response to a signal at said first sample and hold output being greater than a signal at said second sample and hold output, and for producing a second output signal in response to a signal at said second sample and hold output being greater than a signal at said first sample and hold output;
   c. a control circuit having an input connected to said comparison circuit output and having first and second outputs for producing repetitive first and second control signals respectively, said first and second control signals alternating with each other and having relative time durations that are controlled as a function of said first and second output signals produced by said comparison circuit;
   d. means connected between said control circuit outputs and said sample and hold circuit control inputs for controlling the sampling times as a function of said first and second control signals;
   e. means connecting said switching circuit to said control inputs of said first and second sample and hold means for controlling the sampling times as a function of said first and second switching signals;
   f. and means connected to said control circuit outputs for controlling the frequency and time duration of reception of said radio receiver as a function of said first and second control signals.

2. The improved arrangement of claim 1 wherein one of said control signals has a substantially long time duration and the other of said control signals has a substantially short time duration, and wherein the control signal having the long duration and the control signal having the short duration is determined by said output signals of said comparison circuit.

3. In a radio receiver having a local oscillator that determines the frequency of reception of said receiver, an improved arrangement for causing said receiver to receive the stronger of two signals on different radio frequencies comprising:
   a. first means for deriving a first signal indicative of the strength of a radio frequency signal being received by said receiver;
   b. first and second sample and hold means each having a signal input coupled to said first means, each having a control input for causing said sample and hold means to sample the signal applied thereto, and each having an output for its sampled and held signal;
   c. comparison means coupled to said first and second sample and hold means outputs for producing first and second comparison signals indicative of the relative magnitudes of said sampled and held signals;
   d. a switching circuit for producing first and second alternating switching signals having first and second time durations that are different, said switching circuit having an input coupled to said comparison means for changing the relative time durations of said first and second switching signals in response to a transition between said first and second comparison means output signals;
   e. means connecting said switching circuit to said control inputs of said first and second sample and hold means for controlling the sampling times as a function of said first and second switching signals;
   f. and means connecting said switching circuit to said local oscillator for controlling the frequency of said local oscillator in response to the presence of said first and second switching signals.

4. The improved arrangement of claim 3 wherein one of said time durations is relatively long, and the other of said time durations is relatively short.

5. The improved arrangement of claim 3 wherein one of said time durations is relatively long, and the other of said time durations is relatively short.

6. In a radio receiver having a local oscillator with first and second inputs for causing said oscillator to produce first and second frequencies respectively and thereby determine the frequency of reception of said receiver, an improved arrangement for causing said receiver to receive the stronger of two signals on two different radio frequencies comprising:

a. first means for deriving from said receiver a first signal indicative of the strength of a radio frequency signal being received by said receiver;

b. first and second sample and hold means each having a signal input coupled to said first means, each having a control input for causing said sample and hold means to sample said first signal applied thereto, and each having an output for its sampled and held signal;

c. comparison means coupled to said first and second sample and hold means outputs for producing a first comparison signal in response to said first sampled and held signal being greater than said second sampled and held signal, and for producing a second comparison signal in response to said second sampled and held signal being greater than said first sampled and held signal;

d. a switching circuit having first and second outputs, having means for producing a listening signal and a sampling signal alternately and repetitively, and having an input connected to said comparison circuit for supplying said listening and sampling signals at said first and second outputs respectively in response to said first comparison signal and for supplying said sampling and listening signals at said first and second outputs respectively in response to said second comparison signal;

e. means for connecting said first and second outputs of said switching circuit to said first and second inputs of said local oscillator for controlling the frequency of said local oscillator as a function of said listening and sampling signals produced by said switching circuit;

f. and means connecting said first and second outputs of said switching circuit to said control inputs of said first and second sample and hold circuits respectively for causing said sample and hold circuits to sample and hold signals applied thereto during said sampling and listening signals.

* * * * *

UNITED STATES PATENT OFFICE
CERTIFICATE OF CORRECTION

Patent No. 4,069,455            Dated    January 17, 1978

Inventor(s) Ralph R. Sherman, Jr.

It is certified that error appears in the above-identified patent and that said Letters Patent are hereby corrected as shown below:

Col. 3, line 68, cancel "$\overline{Q}$" and insert -- Q --

Col. 4, line 1, cancel "Q" and insert -- $\overline{Q}$ --

Col. 6, lines 9-12 (Claim 1), cancel paragraph "e.", lines 9 through 12 inclusive line 13, cancel "f." and insert -- e. --

Signed and Sealed this

Twenty-seventh Day of June 1978

[SEAL]

Attest:

RUTH C. MASON
*Attesting Officer*

DONALD W. BANNER
*Commissioner of Patents and Trademarks*